(12) United States Patent
Thaidigsmann et al.

(10) Patent No.: US 9,087,940 B2
(45) Date of Patent: Jul. 21, 2015

(54) PHOTOVOLTAIC SOLAR CELL AND METHOD FOR PRODUCING A PHOTOVOLTAIC SOLAR CELL

(75) Inventors: Benjamin Thaidigsmann, Freiburg (DE); Florian Clement, Freiburg (DE); Daniel Biro, Freiburg (DE); Andreas Wolf, Freiburg (DE); Ralf Preu, Freiburg (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 182 days.

(21) Appl. No.: 13/810,028

(22) PCT Filed: Jul. 11, 2011

(86) PCT No.: PCT/EP2011/003451
§ 371 (c)(1),
(2), (4) Date: Jan. 14, 2013

(87) PCT Pub. No.: WO2012/007143
PCT Pub. Date: Jan. 19, 2012

(65) Prior Publication Data
US 2013/0112262 A1    May 9, 2013

(30) Foreign Application Priority Data
Jul. 12, 2010 (DE) .......... 10 2010 026 960

(51) Int. Cl.
  *H01L 21/00* (2006.01)
  *H01L 31/0224* (2006.01)
  *H01L 31/068* (2012.01)
  *H01L 31/18* (2006.01)

(52) U.S. Cl.
  CPC .. *H01L 31/02245* (2013.01); *H01L 31/022425* (2013.01); *H01L 31/022458* (2013.01); *H01L31/068* (2013.01); *H01L 31/0682* (2013.01); *H01L 31/18* (2013.01); *H01L 31/1804* (2013.01); *Y02E 10/547* (2013.01)

(58) Field of Classification Search
  CPC ............. H01L 31/02245; H01L 31/022458; H01L 31/022425; H01L 31/022433; H01L 31/022441; H01L 31/0682
  USPC ............ 438/48, 57, 72, 98; 257/E21.027
  See application file for complete search history.

(56) References Cited

U.S. PATENT DOCUMENTS

| | | | | |
|---|---|---|---|---|
| 4,838,952 | A * | 6/1989 | Dill et al. ............. | 136/256 |
| 7,820,475 | B2 * | 10/2010 | De Ceuster et al. ..... | 438/98 |
| 2004/0097062 | A1 | 5/2004 | Preu et al. | |
| 2005/0172996 | A1 | 8/2005 | Hacke et al. | |
| 2005/0176164 | A1 | 8/2005 | Gee et al. | |
| 2007/0114653 | A1 * | 5/2007 | Shiono et al. .......... | 257/698 |
| 2010/0243028 | A1 * | 9/2010 | Sainoo et al. .......... | 136/244 |
| 2010/0258177 | A1 * | 10/2010 | Ko et al. ............. | 136/256 |
| 2011/0005582 | A1 * | 1/2011 | Szlufcik et al. ....... | 136/252 |

FOREIGN PATENT DOCUMENTS

| | | | |
|---|---|---|---|
| JP | 2004-235555 | * | 8/2004 |
| JP | 2009130116 | | 6/2009 |
| WO | 9854763 | | 12/1998 |
| WO | 2006029250 | | 3/2006 |
| WO | 2009063754 | | 5/2009 |

OTHER PUBLICATIONS

Agostinelli, G. et al., "Silicon Solar Cells on Ultra-Thin Substrates for Large Scale Production", 21st European Photovoltaic Solar Energy Conference, Sep. 4-8, 2006, Dresden, Germany, pp. 601-604.
Fellmeth, Tobias, et al., "19.5% Efficient Screen Printed Crystalline Silicone Metal Wrap Through (MWT) Solar Cells for Concentrator (2-25X) Applications", AIP Conference Proceedings, Jan. 1, 2010, pp. 47-52.
Van Kerschaver, et al., "A Novel Silicon Solar Cell Structure With Both External Polarity Contacts at the Back Surface", Proceedings of the 2nd World Conference on Photovoltaic Energy Conversion, Vienna, Austria, 1998, 5 pages.
Kray, et al., "Laser Chemical Processing (LCP)—A versatile Tool for Microstructuring applications", Applied Physics A 93, pp. 99-103, 2009.

Hovel, H-J, "Tio2 Anti Reflection Coatings by a Low Temperature Spray Process", Journal of Electrochemical Society, pp. 983-985, 1978.

Reber, S. et al., "Epitaxy of Emitters for Crystalline Silicon Solar Cells", Proceedings of the 17th European Photovoltaic Solar Energy Conference, Munich, 2001, pp. 1612-1616.

Clement et al., "Processing and Comprehensive Characterisation of Scree-Printed mc-si Metal Wrap Through (MWT) Solar Cells", Proceedings of the 22nd European Photovoltaic Solar Energy Conference, Milan, 2007, 4 pages.

Gee et al. "Emitter Wrap-Through Solar Cell", Proceedings of the 23rd IEEE Photovoltaic Specialists Conference, Louisville, pp. 1-6, 1993.

\* cited by examiner

*Primary Examiner* — Michael Trinh
(74) *Attorney, Agent, or Firm* — Volpe and Koenig, P.C.

(57) ABSTRACT

The invention relates to a method for producing a photovoltaic solar cell having a front side designed for coupling in light, comprising the following method steps: A Producing a plurality of cutouts in a semiconductor substrate of a base doping type, B Producing one or more emitter regions of an emitter doping type at least at the front side of the semiconductor substrate, wherein the emitter doping type is opposite to the base doping type, C Applying an electrically insulating insulation layer and D Producing metallic feed through structures in the cutouts, at least one metallic base contact structure at the rear side of the solar cell, which is formed in an electrically conductive manner with the semiconductor substrate in a base doping region, at least one metallic front-side contact structure at the front side of the solar cell, which is formed in an electrically conductive manner with the emitter region at the front side of the semiconductor substrate, and at least one rear-side contact structure at the rear side of the solar cell, which is formed in a manner electrically conductively connected to the feed through contact structure. The invention is characterized in that in method step B and/or a further method step in addition a feed through emitter region of the emitter doping type extending from the front side to the rear side is formed in each case in the semiconductor substrate on the walls of the cutouts, in that in method step C the insulation layer is applied in a manner covering the rear side of the semiconductor substrate, if appropriate further intervening intermediate layers, in that in method step D the rear-side contact structure is applied to the insulation layer, if appropriate to further intermediate layers, in such a way that the rear-side contact structure extends to regions of the semiconductor substrate having base doping and, in these regions, on account of the intervening insulation layer, an electrical insulation is formed between rear-side contact structure and semiconductor substrate, and the base contact structure is applied to the insulation layer, if appropriate to further intermediate layers, in such a way that the base contact structure penetrates through the insulation layer at least in regions, such that an electrically conductive connection is produced between base contact structure and semiconductor substrate. The invention furthermore relates to a photovoltaic solar cell.

10 Claims, 4 Drawing Sheets

Figure 2

| 0 | Surface processing |
|---|---|
| A0/C | Producing the diffusion barrier/insulation layer |
| A | Producing the cutouts |
| A1 | Cleaning steps |
| B | Emitter diffusion and etching-back of the dopant source |
| B1 | Producing the antireflection layer on the front side |
| D | Producing the contact structures |

Figure 3

| 0 | Surface processing |
|---|---|
| A0 | Producing the diffusion barrier/insulation layer |
| A | Producing the cutouts |
| A1 | Cleaning steps |
| B | Emitter diffusion and etching-back of the dopant source |
| C | Producing the insulation and passivation layer |
| C1 | Producing the antireflection layer on the front side |
| D1 | Screen printing of the contact structures |
| D2 | Contact firing |
| D3 | Producing local contacts by means of laser (LFC) |
| D4 | Heat treatment |

Figure 4

| 0 | Surface processing |
|---|---|
| A0 | Producing the diffusion barrier/insulation layer |
| A | Producing the cutouts |
| A1 | Cleaning steps |
| B | Emitter diffusion and etching-back of the dopant source |
| C | Producing the insulation and passivation layer |
| C1 | Producing the antireflection layer on the front side |
| D1' | Producing local contacts |
| D2' | Screen printing of the contact structures |
| D3' | Contact firing |
| D4' | Heat treatment |

PHOTOVOLTAIC SOLAR CELL AND METHOD FOR PRODUCING A PHOTOVOLTAIC SOLAR CELL

BACKGROUND

The invention relates to a photovoltaic solar cell and to a method for producing a photovoltaic solar cell.

Photovoltaic solar cells typically consist of a semiconductor structure having a base region and an emitter region, wherein the semiconductor structure is typically substantially formed by a semiconductor substrate, such as a silicon substrate, for example. Light is coupled into the semiconductor structure typically via the front side of the solar cell, such that generation of electron-hole pairs takes place after absorption of the coupled-in light in the solar cell. A pn junction forms between base and emitter region, the generated charge carrier pairs being separated at said junction. Furthermore, a solar cell comprises a metallic emitter contact and also a metallic base contact, which are respectively electrically conductively connected to the emitter and to the base. Via these metallic contacts, the charge carriers separated at the pn junction can be conducted away and thus fed to an external electric circuit or an adjacent solar cell in the case of module interconnection.

Various solar cell structures are known, wherein the present invention relates to those solar cell structures in which both electrical contacts of the solar cell are arranged on the rear side, wherein electrical contact can be made with the base of the solar cell via a metallic base contact structure arranged on the rear side, and electrical contact can be made with the emitter of the solar cell via a metallic rear-side contact structure arranged on the rear side. This is in contrast to standard solar cells, in which typically the metallic emitter contact is situated on the front side and the metallic base contact is situated on the rear side of the solar cell.

In this case, the invention relates to a specific configuration of a solar cell with which contact can be made on the rear side, the metal wrap-through solar cell (MWT solar cell). This solar cell, known from EP 985233 and van Kerschaver et al. "A novel silicon solar cell structure with both external polarity contacts on the back surface" Proceedings of the $2^{nd}$ World Conference on Photovoltaic Energy Conversion, Vienna, Austria, 1998, indeed has a metallic front-side contact structure arranged at the front side of the solar cell designed for coupling in light, said front-side contact structure being electrically conductively connected to the emitter region. However, the solar cell furthermore has a multiplicity of cutouts extending from the front side to the rear side in the semiconductor substrate, metallic feedthrough structures penetrating through said cutouts and said cutouts being electrically conductively connected on the rear side to one or more metallic rear-side contact structures, such that electrical contact can be made with the emitter region on the rear side via the rear-side contact structure, the feedthrough structure and the front-side contact structure.

The MWT structure has the advantage that the charge carriers are collected from the emitter at the front side via the front-side contact structure and, consequently, no ohmic losses arise as a result of possible charge carrier transport within the semiconductor substrate from the front side to the rear side with regard to the emitter region. Furthermore, the capability of making contact both with the base region and with the emitter region on the rear side results in a simpler interconnection of the MWT solar cells in the module compared with standard solar cells.

What is disadvantageous about the MWT structure is that, compared with standard solar cells, it is necessary to produce additional structures such as, for example, the cutouts and the metallic feedthrough structures through the cutouts, thus resulting in a higher complexity and hence higher costs compared with the production of standard solar cells. Moreover, in particular in the case of inaccurate processing on the walls of the cutouts and also in the region in which the rear-side contact structures cover the rear side of the solar cell, there are risks concerning the formation of additional loss mechanisms; in particular, short-circuit currents can occur if the rear-side contact structure through a fault penetrates into the base region of the semiconductor substrate (so-called "spiking"), as a result of which the efficiency of the solar cell is considerably reduced.

For this reason, EP 0 985 233 proposes leading the emitter through the cutouts and, at the rear side, at least beyond the regions covered by the rear-side contact structure, such that the rear-side contact structure, serving for making contact with the emitter externally, covers no region of the semiconductor substrate having the base doping.

However, this requires complex processing and a plurality of cost-intensive masking steps.

SUMMARY

Therefore, the invention is based on the object of providing a photovoltaic solar cell having an MWT structure, and a method for producing such a solar cell which is suitable for implementation in industrial production lines and, in particular, is more cost-effective than the previously known MWT structures and methods for producing them.

This object is achieved by a method as well as a photovoltaic solar cell according to the invention. Advantageous configurations of the method are found below and in the claims. Advantageous configurations of the solar cell are found below and in the claims.

The photovoltaic solar cell according to the invention has a front side designed for coupling in light and comprises a semiconductor substrate of a base doping type, and at least one emitter region of an emitter doping type formed at the front side, said emitter doping type being opposite to the base doping type. In this case, doping types are the n-type doping and the p-type doping opposite thereto.

The solar cell furthermore comprises at least one metallic front-side contact structure which is formed on the front side for the purpose of collecting current and which is electrically conductively connected to the emitter region, at least one metallic base contact structure which is arranged at a rear side of the solar cell and is electrically conductively connected to the semiconductor substrate in a region of the base doping type, at least one cutout extending from the front side to the rear side in the semiconductor substrate and at least one metallic feed-through structure, wherein the feedthrough structure is arranged in the cutout from the front side to the rear side of the semiconductor substrate and is electrically conductively connected to the front-side contact structure, and at least one metallic rear-side contact structure which is arranged at the rear side and is electrically conductively connected to the feedthrough structure.

With regard to this basic construction, the solar cell according to the invention thus corresponds to the previously known MWT structure. What is essential is that, in the case of the solar cell according to the invention, a feedthrough emitter region extending from the front side to the rear side is formed in the semiconductor substrate on the walls of the cutout. Furthermore, an electrically insulating insulation layer is arranged on the rear side of the semiconductor substrate, if appropriate on further intermediate layers, and covers the rear side at least in the regions surrounding the cutout. The rear-side contact structure is arranged on the insulation layer, if appropriate on further intermediate layers, such that the rear-side contact structure is electrically insulated by the insulation layer from the semiconductor substrate lying below the insulation layer.

The solar cell according to the invention thus has for the first time an MWT structure in which, on the one hand, a feedthrough emitter region extending from the front side to the rear side is formed on the walls of the cutout, but in which the rear-side contact structure assigned to the emitter has no direct contact with the semiconductor substrate, but rather is only electrically conductively connected via the metallic feedthrough structure to the metallic front-side contact structure arranged on the front side and via said contact structure to the emitter region at the front side.

The invention is based on the applicant's insight that the solar cell mentioned can surprisingly be produced with only very low residual risks with regard to the loss mechanisms mentioned in the introduction and thus makes possible a cost-effective implementation of the basic MWT concept in industrial manufacture.

The solar cell according to the invention is preferably produced by a method according to the invention or a preferred embodiment thereof.

The method according to the invention for producing a photovoltaic solar cell having a front side designed for coupling in light comprises the following method steps:

A method step A involves producing a plurality of cutouts in a semiconductor substrate of a base doping type.

A method step B involves producing one or more emitter regions of an emitter doping type at least at the front side of the semiconductor substrate, wherein the emitter doping type is opposite to the base doping type.

A method step C involves applying an electrically insulating insulation layer on the rear side of the semiconductor substrate, and a method step D involves producing metallic feedthrough structures in the cutouts. Furthermore, method step D involves producing at least one metallic base contact structure at the rear side of the solar cell, which is formed in an electrically conductive manner with the semiconductor substrate in a base doping region. Furthermore, method step D involves producing at least one metallic front-side contact structure at the front side of the solar cell, which is formed in an electrically conductive manner with the emitter region at the front side of the semiconductor substrate, and producing at least one rear-side contact structure at the rear side of the solar cell, which is formed in a manner electrically conductively connected to the feedthrough contact structure.

These method steps are also known in the production of previously known MWT structures.

The method according to the invention is distinguished by the fact that in method step B in addition a feedthrough emitter region of the emitter doping type extending from the front side to the rear side is formed in each case in the semiconductor substrate on the walls of the cutouts, and in method step C the insulation layer is applied in a manner covering the rear side of the semiconductor substrate, if appropriate further intervening intermediate layers. Furthermore, in the method according to the invention, in method step D the rear-side contact structure is applied to the insulation layer, if appropriate to further intermediate layers, such that the rear-side contact structure covers regions of the semiconductor substrate having base doping and, in these regions, on account of the intervening insulation layer, an electrical insulation is formed between rear-side contact structure and semiconductor substrate. Furthermore, in method step D, the base contact structure is applied to the insulation layer, if appropriate to further intermediate layers, in such a way that the base contact structure penetrates through the insulation layer at least in regions, and an electrically conductive connection is produced between base contact structure and semiconductor substrate. The connection is formed in a region of the semiconductor substrate having base doping.

By virtue of the fact that no emitter region has to be formed at the rear side in the method according to the invention and the solar cell according to the invention, a considerable simplification of the production method and hence a reduction of costs are achieved.

The invention is furthermore based on the applicant's insight that insulation layers can be produced in a simple manner by known methods, in such a way that although a metallic rear-side contact structure applied to the insulation layer covers regions of the semiconductor substrate having base doping, it is electrically insulated therefrom by the insulation structure and, in particular, no "spiking", i.e. faulty penetration of the insulation layer through the rear-side contact structure, whatsoever occurs and, consequently, no losses of efficiency as a result of short-circuit currents based thereon occur. Consequently, the solar cell according to the invention and the method according to the invention furthermore overcome the previously prevailing prejudice that there is a high risk of metallic contact structures penetrating through an insulation layer and thereby causing short-circuit currents.

Furthermore, the risk of short circuits between regions of the semiconductor substrate having base doping and the rear-side contact structure associated with the emitter is reduced in the solar cell according to the invention by the use of metallization methods which do not attack the insulation layer and form no contact with the semiconductor substrate. Preferably, therefore, the rear-side contact structure is produced by screen printing using specific printing pastes which do not attack the insulation layer and form no contact with the semiconductor substrate. The use of screen printing pastes containing no glass frit is particularly advantageous for this purpose.

Furthermore, the solar cell according to the invention and the method according to the invention avoid risks resulting from short circuits between through-metallization and semiconductor substrate in the cutouts by virtue of the fact that emitter regions are likewise formed on the walls of the cutouts and it is thus part of the functional principle of the solar cell according to the invention that the feedthrough structures can be electrically conductively connected to the walls of the cutouts and the feedthrough emitter regions adjoining the latter, without causing short-circuit currents. In particular, it is thus possible to dispense with the insulation layers on the walls of the cutouts which are necessary in the case of previously known MWT structures and which can only be produced by means of complex process steps and often have fault sources as a result of holes.

The solar cell according to the invention and the method according to the invention thus constitute an optimization of the MWT structure with regard to cost-effective industrial manufacture and avoiding losses of efficiency in particular on account of short-circuit currents. The insulation layer on the rear side additionally affords the possibility of reducing the contact area between base contact structure and semiconductor substrate and, consequently, of at least partly achieving a surface passivation and an improvement in internal reflection. This leads to lower recombination currents or higher charge carrier generation rates and thus to higher efficiencies in comparison with making contact with the semiconductor substrate over a large area.

In one advantageous embodiment of the method according to the invention, no emitter region extending parallel to the rear side is formed in a manner adjoining the cutout at the rear side of the semiconductor substrate. Correspondingly, the photovoltaic solar cell on the rear side preferably has no emitter region extending parallel to the rear side. Although, as explained above, the feedthrough emitter region extends from the front side to the rear side and will therefore cover, if appropriate, a negligibly small region of the rear side, preferably no emitter regions are formed parallel to the rear side of the semiconductor substrate at the rear side, as known from the prior art.

In the prior art, the emitter region formed at the rear side covered at least that region of the rear side at which the rear-side contact structure is formed. In the preferred embodiment of the method and preferred configuration of the solar cell according to the invention, however, no such rear-side emitter region is formed, and so the metallic rear-side contact structure extends over regions of the semiconductor substrate which have a base doping, but is electrically insulated therefrom by the intervening insulation layer. This results in a reduction of costs during production, in particular since high throughput methods which do not allow an emitter structure to be formed on both sides can be used for emitter formation. This is the case for back-to-back diffusions known per se, for example, in which the semiconductor structures are guided through the diffusion process in a manner arranged with the sides that are not to be diffused bearing against one another.

The solar cell according to the invention therefore preferably has at the rear side a region in which the rear-side contact structure is electrically insulated from the base-doped semiconductor substrate by the intervening insulation layer. Correspondingly, the method according to the invention is preferably embodied in such a way that a layer structure of this type results after the completion of the solar cell. Preferably, at least 30%, more preferably at least 50%, in particular at least 70%, of the rear-side contact structure extends over regions of the semiconductor substrate having base doping and is electrically insulated therefrom by the abovementioned insulation layer. In this preferred embodiment, therefore, at least 30%, preferably at least 50%, in particular at least 70%, of the area of the rear-side contact structure at the rear side overlaps base-doped regions of the semiconductor substrate.

In one preferred embodiment of the method according to the invention, method step B is designed in such a way that the emitter structure is formed only on the front side and, if appropriate, in the cutouts produced in method step A. It is particularly advantageous to apply a dopant source on one side by means of spraying, rolling, printing, a spin-on process or APCVD or PECVD deposition with subsequent heating of the semiconductor substrate for at least 15 min to at least 750° C., as a result of which the emitter is formed by diffusion of the dopant into the semiconductor substrate.

In a further preferred embodiment of the method according to the invention, an emitter is formed on the front side of the semiconductor substrate by the methods mentioned. Method step A is carried out only after the emitter has been formed, in such a way that during or after the production of the cutouts, an emitter is formed on the inner wall of the cutouts. The use of a liquid-guided laser beam is particularly advantageous for this purpose, wherein the liquid used is enriched with a dopant of the emitter doping type and, if appropriate, an etching liquid and, consequently, in one step the cutouts are produced and the emitter is formed on the inner area thereof.

Such a method is known from "Laser Chemical Processing (LCP)—A versatile tool for microstructuring applications", Kray et al., Applied Physics A 93, 2009.

It lies within the scope of the invention that in method step B an emitter is formed at the front and rear sides of the semiconductor substrate and the emitter is subsequently removed again at the rear side. However, it is advantageous that before method step B, if appropriate with interposition of further method steps, in a method step A0 a diffusion barrier layer covering the rear side of the semiconductor substrate is applied to the rear side of the semiconductor substrate, in order to avoid diffusion of doping material through the diffusion barrier layer onto the semiconductor substrate. As a result, in a simple manner, in method step B the formation of an emitter at the rear side is avoided and the step of removing the emitter on the rear side is correspondingly obviated.

In particular, it is advantageous to carry out method step A0 before method step A, if appropriate with interposition of further method steps. As a result, in method step A cutouts are also produced in the diffusion barrier layer and a diffusion barrier is thus produced in a simple manner, said diffusion barrier making it possible for dopants to penetrate into the cutouts and thus making it possible to form the feedthrough emitters. Particularly when applying the diffusion barrier layer in method step A0 in such a way that it covers the entirety of the rear side, there is no need to use any cost-intensive maskings whatsoever or appropriate methods for forming the emitter regions.

A further preferred embodiment of the method according to the invention is based on the use of an emitter etching-back step on one side after emitter diffusion. For this purpose, method step A0 (applying a diffusion barrier on the rear side) is replaced by a method step Ba wherein the emitter is removed again on the rear side after diffusion has taken place. Wet-chemical etching methods and plasma etching methods on one side can be used for this purpose.

In the solar cell according to the invention, preferably in each cutout the feedthrough emitter region extending from the front side to the rear side is electrically conductively connected to the metallic feedthrough structure. Correspondingly, such an electrically conductive connection is preferably formed in method step D. Ohmic conduction losses are thereby reduced.

In one preferred embodiment of the method according to the invention, in method step D the electrically conductive connection between base contact structure and semiconductor substrate is produced by means of local action of heat by a laser.

The formation of local electrically conductive connections between a semiconductor substrate on which an insulation layer is applied and a metal layer is applied thereabove is known per se (so-called "Laser Fired Contacts", LFC) and described in US2004097062. A particularly cost-effective realization of the method according to the invention is possible by combining this technique for producing the electrically conductive connection between rear-side contact structure and base region of the semiconductor substrate.

In particular, in this advantageous configuration a simplification of the method is achieved in which the insulation layer is applied to the rear side over the whole area. As a result, the insulation layer serves firstly as electrical insulation between rear-side contact structure and semiconductor substrate and also between the predominant proportion of the area of the base contact structure and the semiconductor substrate. It is only in the local regions in which, by means of laser action and momentary local melting of rear-side contact structure, insulation layer and the adjoining region of the semiconductor substrate, a melt mixture is produced that an electrically conductive connection between rear-side contact structure and semiconductor substrate arises in the solidified melt mixture. The combination of the insulation layer applied over the whole area with the production of the base contact-making by means of local heating by a laser thus makes possible a very extensive reduction of the process steps and thus a high cost saving.

In a further advantageous embodiment, in order to produce an electrical contact between semiconductor substrate and base contact structure, before the base contact structure is applied, small cutouts are produced in the insulation layer. At these locations, therefore, there is a direct contact between semiconductor substrate and base contact structure. The production of the cutouts is preferably achieved by laser ablation, application of etching pastes or masked etching-back. The method of producing local cutouts in the insulation layer with subsequent formation of the base contact structure is known from "Silicon Solar Cells on Ultra-Thin Substrates for Large Scale Production", G. Agostinelli et al., 21$^{st}$ EU PVSEC, Dresden, 2006.

One particularly advantageous embodiment of the method according to the invention is based on the use of specific pastes in combination with a high-temperature step for producing the local contacts between semiconductor substrate and base contact structure. Preferably, the paste used for this purpose contains glass frit, preferably up to 10% lead- and/or bismuth-boron glass, or pure lead and/or bismuth oxides. In a method step Da such a paste is applied at local regions, preferably with an area proportion of 0.1% to 20%, particularly preferably of 0.1% to 10%. In a method step Db the semiconductor substrate is greatly heated, preferably to temperatures of at least 700° C. for a time duration of at least 5 s. In this case, method step Db can be carried out temporally before or after the actual formation of the base contact structure in step D. In order to support the formation of a better local back surface field, it is advantageous to use a paste enriched with phosphorus or other elements corresponding to the base doping type. If the base doping is a p-type doping, the paste contains corresponding dopants which allow a p-type doping. In particular, aluminum, boron and/or gallium are preferably contained.

Preferably, the base contact structure covers at least 30%, preferably at least 50%, in particular at least 80%, of the rear side of the semiconductor substrate. The aforementioned percentage indications relate to area percent, independently of whether the base contact structure is applied to the rear side of the semiconductor substrate with interposition of the insulation layer or directly.

In order to reduce recombination losses, it is advantageous for at least 50%, preferably at least 70%, in particular at least 90%, of the base contact structure to be electrically isolated from the semiconductor substrate by the insulation layer. The aforementioned percentage indications relate to area percent.

The insulation layer is advantageously embodied as a dielectric layer. Investigations by the applicant revealed that, in particular, an insulation layer embodied as a layer system composed of aluminum oxide and silicon nitride, preferably having a total thickness in the range of 70 nm to 130 nm, preferably approximately 100 nm, is suitable for the method according to the invention and the solar cell according to the invention. It likewise lies within the scope of the invention to form the insulation layer as a silicon oxide layer, silicon nitride layer, silicon carbide layer, titanium dioxide layer, aluminum oxide layer, silicon-rich oxynitride layer or mixture of the aforementioned layers. The insulation layer advantageously has a thickness in the range of 10 nm to 1 mm, preferably in the range of 20 nm to 100 μm, with further preference of 30 nm to 1 μm, particularly preferably of 30 nm to 300 nm. Furthermore, it lies within the scope of the invention to form the insulation layer as a layer structure composed of a plurality of layers. Although this increases the process complexity, the risk of a punch-through of the insulation layer through rear-side contact structure and thus the risk of short-circuit currents in this region are virtually precluded by a layer structure. Moreover, a layer optimized with regard to the rear-side passivation can be combined with a layer optimized for the greatest possible insulation effect, as a result of which the efficiency of the solar cell can be increased further. In particular, it is advantageous to use a layer having surface charges opposite to the base doping type, in order to form a field effect passivation of the rear side. Furthermore, the passivation of the rear side is improved by the use of layers such as thermally grown oxide layers, for example, which achieve a saturation of surface states.

A further simplification and hence reduction of the costs of the method according to the invention arise by virtue of the fact that in method step A0 the diffusion barrier layer is additionally embodied as an electrically insulating layer, by virtue of the fact that the diffusion barrier layer is not removed in the method steps following method step B. Consequently, the diffusion barrier layer additionally fulfils the function of electrical insulation. In particular, it is therefore advantageous not to apply an additional insulation layer in method step C. In this advantageous configuration of the method according to the invention, therefore, method step C is simultaneously performed in method step A0 and, by merely applying a layer in method step A0 to the rear side of the semiconductor substrate, preferably to the whole area of the rear side, the desired function of the diffusion barrier and of the subsequent electrical insulation is ensured and, furthermore, there is no need for a process step in order to perform a possible removal of a diffusion barrier layer. Layers which fulfill the requirements described are, for example, silicon nitride, aluminum oxide, titanium oxide, tantalum oxide, silicon oxide, silicon oxynitride, mixtures of the substances mentioned or layer systems containing one or more of said layers.

A further reduction of the risk of short circuits between rear-side contact structure and semiconductor substrate having base doping is achieved by a thickening of the diffusion barrier and insulation layer described in the previous section by at least one additional layer. This thickening preferably takes place before method step D. In particular, silicon nitride having a thickness of 10 nm to 250 nm, preferably of 30 nm to 150 nm, with further preference of 50 nm to 130 nm, can be used for this purpose.

Investigations by the applicant have revealed that, in particular, a dielectric layer, preferably a silicon oxide layer, fulfills both the function of a diffusion barrier for avoiding diffusion of doping material, and the function of an electrical insulation. Preferably, the layer for fulfilling both functions has an initial thickness in the range of 100 nm to 500 nm, with further preference in the range of 150 nm to 400 nm. In a manner governed by the process, the thickness of the dielectric layer decreases during the method steps following the application of the layer. If the diffusion barrier layer is simultaneously used as an insulation layer, if appropriate using a layer or a layer system additionally applied before method step D, it is preferred to use a total layer thickness of the insulation layer in the range of 80 nm to 400 nm, in particular in the range of 100 nm to 250 nm. It is particularly advantageous to form a diffusion barrier layer which also fulfills the function of an insulation layer and simultaneously passivates the rear side of the solar cell. Silicon oxide, in particular, can be used as diffusion barrier layer, insulation layer and passivation layer, if appropriate in combination with a silicon nitride layer having a layer thickness in the range of 10 nm to 250 nm, preferably of 30 nm to 150 nm, with further preference of 50 nm to 130 nm. It likewise lies within the scope of the invention to form the diffusion barrier as a layer composed of silicon nitride, aluminum oxide, titanium oxide, tantalum oxide, silicon oxide, silicon oxynitride, mixtures of the aforementioned substances or layer systems containing one or more of said layers.

In one preferred embodiment of the method according to the invention, before method step B, if appropriate with interposition of further method steps, the rear side of the semiconductor substrate is leveled. The semiconductor substrates typically used, in particular monocrystalline silicon wafers, multicrystalline silicon wafers or microcrystalline silicon wafers, typically have unevennesses which can lead to nonuniform coverage and losses of efficiency resulting therefrom. Leveling avoids such losses of efficiency. The leveling is preferably effected by removing a semiconductor layer at one side, at the rear side, of the semiconductor substrate. In particular, it is advantageous to achieve the removal at one side by wet-chemical etching, by laser ablation or by plasma etching.

Preferably, in the method according to the invention, the diffusion barrier is embodied as a silicon oxide layer. In particular, it is advantageous for the silicon layer to be applied in a manner comprising one of the following method steps: introducing the semiconductor substrate into an atmosphere composed of nitrogen, oxygen, water, dichloroethylene or other gases or mixtures of the aforementioned substances and heating the semiconductor substrate in the aforementioned atmosphere to temperatures of at least 700° C. for at least 5 min.

Applying the diffusion barrier layer, if appropriate the insulation and passivation layer, on one side, on the rear side, of the semiconductor structure by means of the method known per se plasma enhanced chemical vapor deposition (PECVD), atmospheric pressure chemical vapor deposition (APCVD) or cathode sputtering has the advantage that it is not necessary to remove the silicon dioxide layer at undesired regions such as, for example, the front side of the semiconductor substrate. It is likewise advantageous to use diffusion barriers which are applied by pressure, spraying or a spin-on process, since methods that can be industrially implemented cost-effectively are available for this purpose.

Applying the silicon dioxide layer on both sides, on the front and rear sides, of the semiconductor structure as a diffusion barrier layer and/or insulation layer and/or passivation layer and subsequently removing the silicon dioxide layer on the front side has the advantage that cost-effective methods can be used for producing the silicon dioxide layer, in particular the production of the silicon dioxide layer as thermal silicon dioxide layer on both sides is known per se. Applying on both sides the silicon dioxide layer or other layers such as, for example, silicon nitride, aluminum oxide, titanium oxide, tantalum oxide, silicon oxynitride, mixtures of the aforementioned substances or layer systems which can be used as a diffusion barrier layer, by means of PECVD, APCVD, printing, spraying or deposition in a dipping bath, likewise lies within the scope of the invention.

Advantageous methods for removing the diffusion barrier in undesired regions, at least of the front side, include single-sided wet-chemical etching-back, wet-chemical etching-back using an etching mask, plasma etching, laser ablation and also the use of etching pastes by means of a printing technique.

Applying the diffusion barrier layer (silicon oxide, silicon nitride, aluminum oxide, titanium oxide, tantalum oxide, silicon oxynitride, mixtures of the aforementioned substances or layer systems) on one side by means of a printing technique onto the rear side of the semiconductor structure likewise has the advantage that there is no need to subsequently remove the silicon dioxide layer on the front side. Application by means of printing technology is preferably effected by the material used for producing the diffusion barrier layer being embedded on into a carrier substance and subsequently being applied to the semiconductor substrate by inkjet or screen printing. This is preferably followed by a drying step in which the carrier substance is at least partly evaporated and the diffusion barrier layer is stabilized.

Applying the diffusion barrier layer on one side by means of spraying or rolling onto the rear side of the semiconductor structure likewise has the advantage that there is no need to remove a silicon dioxide layer on the front side. The production of dielectric layers by means of spraying is known per se and described in "TiO2 antireflection coatings by a low temperature spray process", Hovel, H. J., Journal of the Electrochemical Society, 1978.

As a result of the combination of applying a diffusion barrier on the rear side of the semiconductor substrate and as a result of the fact that an emitter region is desired in the cutouts in the case of the solar cell according to the invention, the emitter regions of the solar cell according to the invention can be produced in a simple manner. Preferably, in method step B the emitter region at the front side and the feedthrough emitter regions are produced in a manner comprising one of the following method steps:

Producing the emitter regions by means of diffusion after depositing a dopant source both on the front side and on the walls of the cutouts makes it possible to use cost-effective process methods, in particular APCVD, PECVD, spraying, printing, rolling and deposition in a dipping bath, for depositing the dopant source. Carrying out the diffusion in an inline furnace is particularly advantageous.

It likewise lies within the scope of the invention to produce the emitter on the surface of the semiconductor structure at the front side of the semiconductor substrate and on the walls of the cutouts by epitaxially growing a layer that is oppositely doped relative to the base doping, as described in "Epitaxy of emitters for crystalline silicon solar cells", Reber, S. et al., Proceedings of the $17^{th}$ European Photovoltaic Solar Energy Conference, Munich, 2001. This has the advantage that an emitter having high material quality and a defined dopant concentration is formed, as a result of which the solar cell efficiency can be increased.

Furthermore, it lies within the scope of the invention to produce a heterostructure, in which the emitter is deposited by way of a layer. Likewise, the emitter can also be produced by means of ion implantation.

The cutouts in which the feedthrough structure is formed in further method steps are preferably produced by laser ablation. The advantage when using laser methods is that it is possible to have recourse to known process parameters and the method can be integrated cost-effectively in industrial production lines.

Further preferred methods for producing the cutouts include the use of wet-chemical etching methods or plasma etching methods, mechanical drilling processes and liquid jet drilling. In one advantageous embodiment of the method, in the case of liquid jet drilling, a laser is coupled into the liquid jet, whereby the drilling process is accelerated. The liquid jet can contain dopant used to dope the inner wall of the cutouts during the drilling process. This has the advantage that the emitter only has to be implemented on one side in method step B, and the doping of the inner walls of the cutout in method step A, which in this case is preferably performed after method step B, with further preference after method step C, is effected at the same time as the cutouts are produced.

The metallic structures for making contact with the emitter, front-side contact structure, feedthrough contact structure and rear-side contact structure, were designated above by the three terms mentioned in order to identify the spatial arrangement. It lies within the scope of the invention for these structures to be embodied in a multipart fashion; it likewise lies within the scope of the invention to form only one integral metallization structure comprising front-side contact structure, feedthrough structure and rear-side contact structure.

In one preferred embodiment of the method according to the invention, front-side contact structure, rear-side contact structure and feedthrough contact structure are formed by means of screen printing. This affords the advantage that these processes can be used industrially in an inline method and, in particular, the use of screen printing for producing metallic structures is already known and, consequently, it is possible to have recourse to previously known process parameters. In this case, screen printing paste containing metal particles is used. In this case, preferably by means of screen printing, a metal-containing paste is applied to the rear side of the semiconductor substrate, if appropriate to further intermediate layers, in such a way that the paste penetrates through the cutouts.

Advantageously, the feedthrough contact structure is formed in such a way that, during the formation of the feedthrough contact structure, the feedthrough emitter region is not damaged, or is only slightly damaged, and, in particular, the feedthrough emitter region formed in method step B is not removed during the formation of the metallic feedthrough contact structure. In particular, it is advantageous in this case to form the feedthrough contact structure by using a silver-containing screen printing paste.

In order to ensure sufficient penetration of the cutouts with screen printing paste, in the method according to the invention preferably after the screen printing paste has been applied on the front side, a pressure difference is produced between front and rear sides of the semiconductor substrate, in such a way that the paste is forced into the cutouts due to the pressure difference. In this preferred embodiment, therefore, due to the pressure difference, the paste is "sucked" from the rear side through the cutouts, with the result that the production of the metallic feedthrough structures is ensured in a simple manner.

When forming the rear-side contact structure by means of screen printing it is particularly advantageous to use silver-containing pastes, preferably without additives which attack the insulation layer on the rear side, in particular without glass frit. It is thus possible to further reduce the risk contact formation and hence of a short circuit between semiconductor substrate of the base doping type and rear-side contact.

Further preferred embodiments of the method according to the invention comprise forming front-side contact structure and/or rear-side contact structure and/or feedthrough contact structure by electrodeposition, dispensing, vapor deposition, cathode sputtering or printing methods such as, for example, inkjet or aerosol.

BRIEF DESCRIPTION OF THE DRAWINGS

Further preferred features and embodiments of the solar cell according to the invention and of the method according to the invention are explained below with reference to the figures and the description of the figures, in which:

FIG. 2 shows a process flow chart of a first exemplary embodiment of a method according to the invention, FIG. 3 shows a process flow chart of a second exemplary embodiment of a method according to the invention, and FIG. 4 shows a process flow chart of a third exemplary embodiment of a method according to the invention.

DETAILED DESCRIPTION OF THE PREFERRED EMBODIMENT

Figure 1:
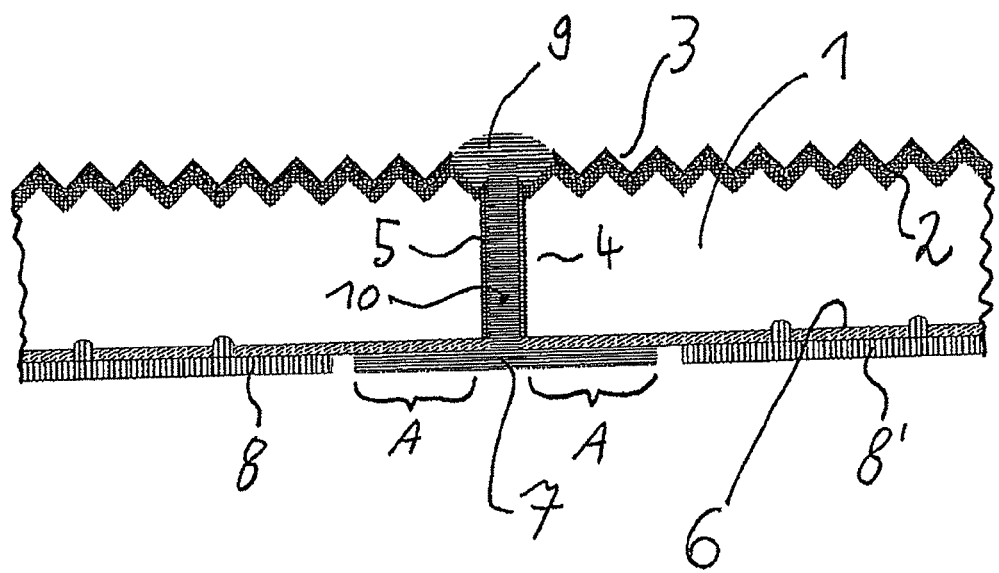
FIG. 1 shows a schematic illustration of a partial excerpt from an exemplary embodiment of a solar cell according to the invention.

The exemplary embodiment of a solar cell according to the invention, as illustrated in FIG. 1, was produced by means of the process elucidated in FIG. 3 hereinafter.

The solar cell according to the invention in FIG. 1 comprises a p-doped semiconductor substrate 1 embodied as a mono- or multicrystalline silicon wafer having a base resistance of 0.1 ohm cm to 10 ohm cm. A front-side emitter region 2 is formed at the front side, illustrated at the top in FIG. 1. The front side has a texturing in order to increase the coupling in of light and an antireflection layer 3 embodied as a silicon nitride layer and having a thickness of approximately 70 nm is additionally arranged on the front side of the semiconductor substrate 1 in order to increase the coupling in of light.

FIG. 1 merely shows a partial excerpt from the solar cell according to the invention with just one cutout 4. The solar cell continues in a mirror-inverted fashion toward the right and left and has a multiplicity of cutouts.

The cutout 4 extends from the front side to the rear side of the solar cell and is embodied approximately in a cylindrical fashion.

A feedthrough emitter region 5 extending from the front side to the rear side is formed on the walls of the cutout.

The rear side of the semiconductor substrate 1 is covered by an insulation and passivation layer 6 formed as a layer system composed of aluminum oxide and silicon nitride having a total thickness of 100 nm. The layer 6 covers the rear side of the semiconductor substrate over the whole area and is in turn covered both by a metallic rear-side contact structure 7 and by a plurality of metallic base contact structures 8, 8', wherein the base contact structures 8, 8' penetrate through the insulation layer 6 locally at a multiplicity of point-like contact-making regions, such that there is an electrical contact between the base contact structures 8, 8' and the semiconductor substrate 1 in the region of the base doping.

A metallic front-side contact structure 9 is formed at the front side of the solar cell in accordance with FIG. 1, said contact structure being electrically conductively connected directly to the emitter region 2, that is to say that no antireflection layer 3 is arranged between front-side contact structure 9 and emitter region 2.

Furthermore, a metallic feedthrough structure 10 is formed in the cutout 4.

Front-side contact structure 9, feedthrough structure 10 and rear-side contact structure 7 are formed integrally and correspondingly electrically conductively connected to one another.

It is essential that, in the regions identified by A and A' in FIG. 1, although the rear-side contact structure 7 covers the semiconductor substrate 1 in the region of the base doping, it is electrically insulated therefrom by the intervening insulation layer 6. No emitter region extending parallel to the rear side is formed at the rear side of the semiconductor substrate 1 and in particular in the regions A and A'. A negligibly small region of the rear side which has an emitter doping is situated only in the region wherein the feedthrough emitter region 5 appears at the rear side of the semiconductor substrate 1.

The front-side contact structure is embodied as in previously known MWT solar cells, presented for example in "Processing and comprehensive characterisation of screen-printed mc-si metal wrap through (mwt) solar cells", Clement et al., Proceedings of the 22$^{nd}$ European Photovoltaic Solar Energy Conference, Milan, 2007.

The local electrically conductive connections (LFC), produced by means of local heating by a laser, between semiconductor substrate 1 and base contact structure 8, 8' are distributed approximately uniformly over the base contact structure and embodied approximately in a punctiform fashion with a spacing in the range of 100 µm to 1 mm, in this case of approximately 500 µm. Overall, approximately 98.5% of the rear side of the semiconductor substrate is covered by the insulation layer, and approximately 1.5% by the electrically conductive point contacts. The solar cell has cutouts having a diameter of approximately 100 µm, wherein the cutouts are arranged on lines; on average, one hole is formed per 4 cm$^2$ solar cell area.

FIG. 2 schematically shows one exemplary embodiment of the method according to the invention. A p-doped multicrystalline silicon wafer having a base resistance of 0.1 ohm cm to 10 ohm cm is subjected to surface processing in a method step 0. In this case, the following method steps are performed: removing surface damage originating from the production of the semiconductor substrate, and forming a texturing at least on the front side in order to improve the light trapping.

Afterward, in a method step A0/C a diffusion barrier is applied over the whole area on the rear side of the semiconductor substrate. The diffusion barrier is embodied as a silicon oxide layer having a thickness of 250 nm and is produced by means of PECVD or thermal oxidation with subsequent etching-back on one side.

In a method step A, a plurality of cutouts, the so-called "MWT holes", are subsequently produced. The MWT holes are produced by means of a laser, as described for example in "Emitter wrap-through solar cell", Gee et al., Proceedings of the 23$^{rd}$ IEEE Photovoltaic Specialists Conference, Louisville, 1993. The holes are formed at those positions of the semiconductor substrate at which the rear-side contact structure is arranged in the subsequent method steps.

In a method step A1, cleaning is then optionally carried out, wherein the semiconductor substrate is freed of possible contaminants and products of the hole drilling process are removed. The cleaning is preferably carried out wet-chemically using caustic liquids such as hydrofluoric acid, potassium hydroxide solution or other substances.

A method step B subsequently involves producing the emitter region at the front side of the semiconductor substrate and the feedthrough emitter region on the walls of the cutouts. For this purpose, by means of deposition from the gas phase, phosphorus-containing glass is deposited on the semiconductor substrate and the emitter is produced by the action of temperature on the front side and also on the walls of the cutouts, that is to say at the regions which are not covered by the diffusion barrier layer. For this purpose, the semiconductor substrate is heated for approximately 45 min to a temperature of approximately 800° C. to 900° C.

The silicate glass that arises in this case is subsequently removed in an etching step by means of dipping the semiconductor substrate into hydrofluoric acid having a concentration of approximately 10% for a time duration of approximately 1 min.

In this exemplary embodiment, the diffusion barrier embodied as a silicon oxide layer and applied in method step A0/C simultaneously serves as an insulation layer and is therefore no longer removed.

Method step A0 therefore encompasses method step C in the exemplary embodiment of the method according to the invention as illustrated in FIG. 2. It is only when using a screen printing method with a subsequent high-temperature step for forming the base contact structure in method step D that the diffusion barrier layer is also reinforced by a silicon nitride layer having a thickness of approximately 60 nm to 120 nm.

A method step B1 subsequently involves applying an antireflection layer to the front side of the semiconductor substrate in order to improve the coupling in of light, wherein the antireflection layer is embodied as a silicon nitride layer having a thickness of approximately 70 nm. The layer can likewise constitute a layer system composed of other layers (silicon dioxide, aluminum oxide; silicon nitride and others).

A method step D subsequently involves forming the metallic contact structures: feedthrough contact structure, rear-side contact structure, base contact structure and front-side contact structure.

FIG. 3 shows a further exemplary embodiment of the method according to the invention, wherein identically identified process steps are performed analogously to the exemplary embodiment in accordance with FIG. 2:

After surface processing in a method step 0, the diffusion barrier is applied to the rear side of the semiconductor substrate over the whole area in a method step A0, the MWT holes are produced in a method step A, and cleaning steps are effected in a method step A1, and the diffusion of the emitter regions from the gas phase takes place in a method step B.

In contrast to the exemplary embodiment illustrated in FIG. 2, however, the diffusion barrier applied in method step A0 is removed again in method step B. Subsequently, a method step C involves applying an insulation and passivation layer as a layer system composed of aluminum oxide and silicon nitride to the rear side of the semiconductor substrate over the whole area, which firstly passivates the semiconductor substrate with regard to the surface recombination rate and secondly performs the function as an insulation layer. The total thickness of the layer system is 100 nm; the layers are produced by PECVD on the rear side of the semiconductor substrate. This has the advantage over the exemplary embodiment illustrated in FIG. 2 that the layer is optimally optimized toward the passivating and insulating property.

An antireflection layer is applied in method step C1.

Afterward, the contact structures are formed in method steps D1 to D4:

For this purpose, front-side contact structure, feedthrough structure and rear-side contact structure are produced by means of screen printing in a method step D1 by means of the application of paste containing metal particles. The metal structures are formed from the applied pastes by means of contact firing in a method step D2.

In method step D2, however, neither the rear-side contact structure nor the base contact structure penetrates through the insulation layer applied in method step C. In order to enable electrical contact to be made with the base region of the semiconductor substrate, therefore, a momentary local melting in point-like regions is achieved in a method step D3 by means of local action of heat by means of a laser according to the LFC process, thereby achieving the electrical contact between base contact structure and semiconductor substrate in the base region.

Method step D4 involves heat treatment at a temperature of approximately 350° C. for a time duration of at least 30 s, in order to anneal the damage and strains that can arise as a result of the LFC process.

FIG. 4 shows a further exemplary embodiment of the method according to the invention, in which identically designated method steps correspond to those in accordance with FIGS. 3 and 2.

Method steps 0, A, A1, B, C and C1 are performed as described for FIG. 3.

Following method step C1, however, the base contact structure is produced as follows:

In a method step D1', paste containing metal particles is applied to the insulation layer on the rear side locally at a plurality of regions by means of screen printing. If appropriate, the locally applied paste is "fired through" in a temperature step at a temperature of at least 700° C., that is to say that a base contact structure penetrating through the insulation layer is produced during the temperature step, said base contact structure thus being electrically conductively connected to the semiconductor substrate in the region of the base doping. Preferably, the contact between semiconductor substrate and base contact structure is produced, however, by "firing through" the locally applied screen printing paste together with the contact firing of the contact structures in method step D3'.

Afterward, in a method step D2', once again by means of screen printing, paste containing metal particles is applied in the regions in which front-side contact structure, feedthrough structure and rear-side contact structure are intended to be produced. In this case, screen printing paste is applied to the front side and rear side in the regions in which the contact structures are intended to be formed. In this case, the cutouts are likewise printed and the paste is sucked into the cutouts by a pressure difference being produced between the front and rear sides. Afterward, contact firing takes place in a method step E3', such that the metal particles contained in the pastes are electrically conductively connected among one another and the front-side contact structure is electrically conductively connected to the emitter region at the front side, but the rear-side contact structure does not penetrate through the insulation layer. The contact firing takes place at a temperature of at least 700° C. for a time duration of at least 5 s. Preferably, a temperature maximum of at least 730° C. is achieved during the time duration mentioned.

Heat treatment as described for FIG. 3 takes place in a method step D4'.

The invention claimed is:

1. A method for producing a photovoltaic solar cell having a front side designed for coupling in light, comprising the following method steps:
A0 applying a diffusion barrier layer covering a rear side of a semiconductor substrate of a base doping type, in order to avoid diffusion of doping material through the diffusion barrier layer,
A producing a plurality of cutouts in the semiconductor substrate (1),
B producing one or more emitter regions of an emitter doping type at least at the front side of the semiconductor substrate, wherein the emitter doping type is opposite to the base doping type,
C applying an electrically insulating insulation layer (6), and
D producing metallic feedthrough structures in the cutouts, at least one metallic base contact structure (8, 8') at a rear side of the solar cell, which is formed in an electrically conductive manner with the semiconductor substrate (1) in a base doping region,
at least one metallic front-side contact structure (9) at the front side of the solar cell, which is formed in an electrically conductive manner with the emitter region (2) at the front side of the semiconductor substrate, and
at least one rear-side contact structure (7) at the rear side of the solar cell, which is formed in a manner electrically conductively connected to the feedthrough contact structure,
in method step B in addition a feedthrough emitter region (5) of the emitter doping type extending from the front side to the rear side is formed in each case in the semiconductor substrate (1) on walls of the cutouts,
in method step C the insulation layer (6) is applied in a manner covering the rear side of the semiconductor substrate,
in method step D
the rear-side contact structure (7) is applied to the insulation layer (6), in such a way that the rear-side contact structure (7) extends over regions of the semiconductor substrate having base doping and, in these regions, at least on account of the intervening insulation layer (6), an electrical insulation is formed between rear-side contact structure (7) and semiconductor substrate (1), and
the base contact structure (8, 8') is applied to the insulation layer (6), in such a way that the base contact structure (8, 8') penetrates through the insulation layer (6) at least in regions, such that an electrically conductive connection is produced between base contact structure (8, 8') and semiconductor substrate (1),
wherein no emitter region (2) extending parallel to the rear side is formed in a manner adjoining the cutouts at the rear side of the semiconductor substrate,
wherein method step A0 is carried out before method step A,
wherein method step A0 is carried out before method step B, and
wherein method step B includes producing the emitter region at the front side of the semiconductor substrate and the feedthrough emitter region on the walls of the cutouts.

2. The method as claimed in claim 1,
in method step A0 the diffusion barrier is embodied as a silicon oxide layer ($SiO_x$), and is applied in a manner comprising one of the following method steps:
applying the silicon oxide layer on one side, on the rear side, of the semiconductor structure by PECVD, or
applying the silicon oxide layer on both sides, on the front and rear sides, of the semiconductor structure and subsequently removing the silicon oxide layer on the front side, wherein the silicon oxide layer is applied by PECVD or as a thermal silicon oxide layer, or
applying the silicon oxide layer on one side by a printing technique onto the rear side of the semiconductor structure, or
applying the silicon oxide layer on one side by spraying onto the rear side of the semiconductor structure.

3. The method as claimed in claim 1, wherein in method step D the electrically conductive connection between base contact structure (8, 8') and the semiconductor substrate (1) is produced by local action of heat by a laser.

4. The method as claimed in claim 1, wherein the insulation layer (6) is embodied as a dielectric layer.

5. The method as claimed in claim 1, wherein in each of the cutouts (4) the feedthrough structure (10) is formed in an electrically conductive manner with the respective feedthrough emitter region (5).

6. The method as claimed in claim 1, wherein before method step B, the rear side of the semiconductor substrate is leveled, by removing a semiconductor layer at one side, at the rear side, of the semiconductor substrate.

7. The method as claimed in claim 1, wherein in method step B the emitter region (2) at the front side and the feedthrough emitter regions are produced in a manner comprising at least one of the following method steps:
producing the emitter regions by diffusion from a gas atmosphere by a dopant-containing gas, or
producing the emitter regions by diffusion after depositing a dopant source, or
growing a highly doped layer onto the surface of the semiconductor substrate, or
producing the feedthrough emitter region while producing the cutouts by a liquid-jet-guided laser using a dopant-containing liquid.

8. The method as claimed in claim 1, wherein rear-side contact structure (7) and feedthrough contact structure are formed integrally.

9. The method as claimed in claim 8, wherein the front-side contact structure (9), the rear-side contact structure (7) and the feedthrough contact structure are formed by screen printing with a metal-containing paste being applied to one side, of the semiconductor substrate in such a way that the paste penetrates through the cutouts.

10. The method as claimed in claim 9, wherein after the metal-containing paste has been applied, a pressure difference is produced between the front and rear sides of the semiconductor substrate, in such a way that the paste is forced into the cutouts due to the pressure difference.

* * * * *